(12) United States Patent
Feng et al.

(10) Patent No.: US 12,274,048 B2
(45) Date of Patent: Apr. 8, 2025

(54) DYNAMIC RANDOM ACCESS MEMORY DEVICE

(71) Applicant: Fujian Jinhua Integrated Circuit Co., Ltd., Quanzhou (CN)

(72) Inventors: Li-Wei Feng, Quanzhou (CN); Janbo Zhang, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 162 days.

(21) Appl. No.: 17/746,995

(22) Filed: May 18, 2022

(65) Prior Publication Data

US 2023/0309291 A1    Sep. 28, 2023

(30) Foreign Application Priority Data

Mar. 22, 2022 (CN) .......................... 202210286521.2
Mar. 22, 2022 (CN) .......................... 202220634718.6

(51) Int. Cl.
*H10B 12/00*    (2023.01)
*G11C 5/06*    (2006.01)

(52) U.S. Cl.
CPC ........... *H10B 12/315* (2023.02); *G11C 5/063* (2013.01); *H10B 12/0335* (2023.02)

(58) Field of Classification Search
None
See application file for complete search history.

(56) References Cited

U.S. PATENT DOCUMENTS

| 6,184,080 B1* | 2/2001 | Miyai | H10B 12/485 |
| | | | 438/399 |
| 6,649,956 B2* | 11/2003 | Yoshida | H10B 12/318 |
| | | | 257/305 |
| 2005/0173750 A1* | 8/2005 | Park | H10B 12/482 |
| | | | 257/E21.655 |
| 2010/0240180 A1* | 9/2010 | Jeon | H01L 29/78 |
| | | | 438/270 |
| 2010/0248437 A1* | 9/2010 | Kim | H01L 29/4236 |
| | | | 438/270 |
| 2010/0327407 A1* | 12/2010 | Kang | H10B 12/482 |
| | | | 257/532 |
| 2019/0157274 A1* | 5/2019 | Chang | H10B 12/34 |
| 2020/0111794 A1* | 4/2020 | Cheng | H10B 12/315 |
| 2020/0273862 A1* | 8/2020 | Wu | H10B 12/0335 |
| 2023/0008188 A1* | 1/2023 | Tung | H10B 12/0335 |

* cited by examiner

*Primary Examiner* — Hrayr A Sayadian
(74) *Attorney, Agent, or Firm* — Winston Hsu

(57) ABSTRACT

A dynamic random access memory device includes a substrate having a first active region, a first isolation region, a second active region, and a second isolation region arranged in order along a first direction. A first bit line is disposed on the first active region and in direct contact with the first active region. A second bit line is disposed on the second isolation region. An insulating layer is disposed between and separate the second bit line and the second isolation region. A storage node contact structure is disposed between the first bit line and the second bit line and is in direct contact with a top surface of the second active region, a sidewall of the first isolation region, and a sidewall of the second isolation region.

11 Claims, 10 Drawing Sheets

DYNAMIC RANDOM ACCESS MEMORY DEVICE

BACKGROUND OF THE INVENTION

1. Field of the Invention

The present invention is related to a semiconductor device. More particularly, the present invention relates to a dynamic random access memory device including storage node contact structures.

2. Description of the Prior Art

A dynamic random access memory (DRAM) device is a kind of volatile memory. A DRAM device usually includes a memory region including a plurality of memory cells and a peripheral region including control circuits. Typically, a memory cell is composed of one transistor and one capacitor electrically coupled to the transistor, which is also known as a 1T1C cell. A digital data is stored in a memory cell by controlling the transistor to charge or discharge the capacitor. The control circuits in the peripheral region may address each of the memory cells in the array region to read, write or erase data by columns of word lines and rows of bit lines that respectively traverse through the array region and are electrically connected to each of the memory cells.

In advanced technology, three-dimensional (3D) structure has been proposed to shrink the memory cells of a DRAM device for a higher memory array density. Buried word lines and stacked capacitors have been widely adopted in the field. Stacked capacitors are vertically disposed on the substrate of and have electrodes extending upwardly, such that the substrate area for forming the capacitors may be saved and the capacitances of the capacitors may be increased by simply increase the height of the electrodes. Currently, a storage node contact structure is provided between and electrically connects each stacked capacitor and the substrate. There is still a need for an optimized storage node contact structure which may provide a better electrical connection to achieve a device performance.

SUMMARY OF THE INVENTION

One objective of the present invention is to provide a dynamic random access memory device including storage node contact structures that respectively have a larger contacting area with the substrate, such that the resistances between the storage node contact structures and the structure may be reduced and an improved performance of the dynamic random access memory device may be achieved.

One embodiment of the present invention provides a dynamic random access memory device including a substrate having a first active region, a first isolation region, a second active region, and a second isolation region arranged in order along a first direction. A first bit line is disposed on the first active region and directly contacting the first active region. A second bit line is disposed on the second isolation region. An insulating layer is disposed between the second bit line and the second isolation region to separate the second bit line from the second isolation region. A storage node contact structure is disposed between the first bit line and the second bit line. The storage node contact structure directly contacts a top surface of the second active region, a sidewall of the first isolation region, and a sidewall of the second isolation region.

Another embodiment of the present invention provides a dynamic random access memory device including a substrate having an active region and two isolation regions at two sides of the active region. Two buried word lines are formed in the active region to divide the active region into a middle portion and two end portions. A bit line is disposed on the middle portion. A storage node contact structure is disposed on each of the end portions and includes a contact portion and a plug portion. The contact portion directly contacts a top surface of the end portions, a sidewall of one of the buried word lines and a sidewall of one of the isolation regions. The plug portion is on the contact portion. A width of the plug portion is larger than a width of the contact portion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

FIG. 1 and FIG. 4 are plan views of the dynamic random access memory device. The drawings on the left sides of FIG. 2, FIG. 3, and FIG. 5 to FIG. 9 are cross-sectional views of the dynamic random access memory device taken along the line AA' as shown in FIG. 1 and FIG. 4. The drawings on the right sides of FIG. 2, FIG. 3, and FIG. 5 to FIG. 9 are cross-sectional views of the dynamic random access memory device taken along the line BB' as shown in FIG. 1 and FIG. 4.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. Other embodiments may be utilized and that structural, logical and electrical changes may be made without departing from the spirit and scope of the present invention.

Figure 1:
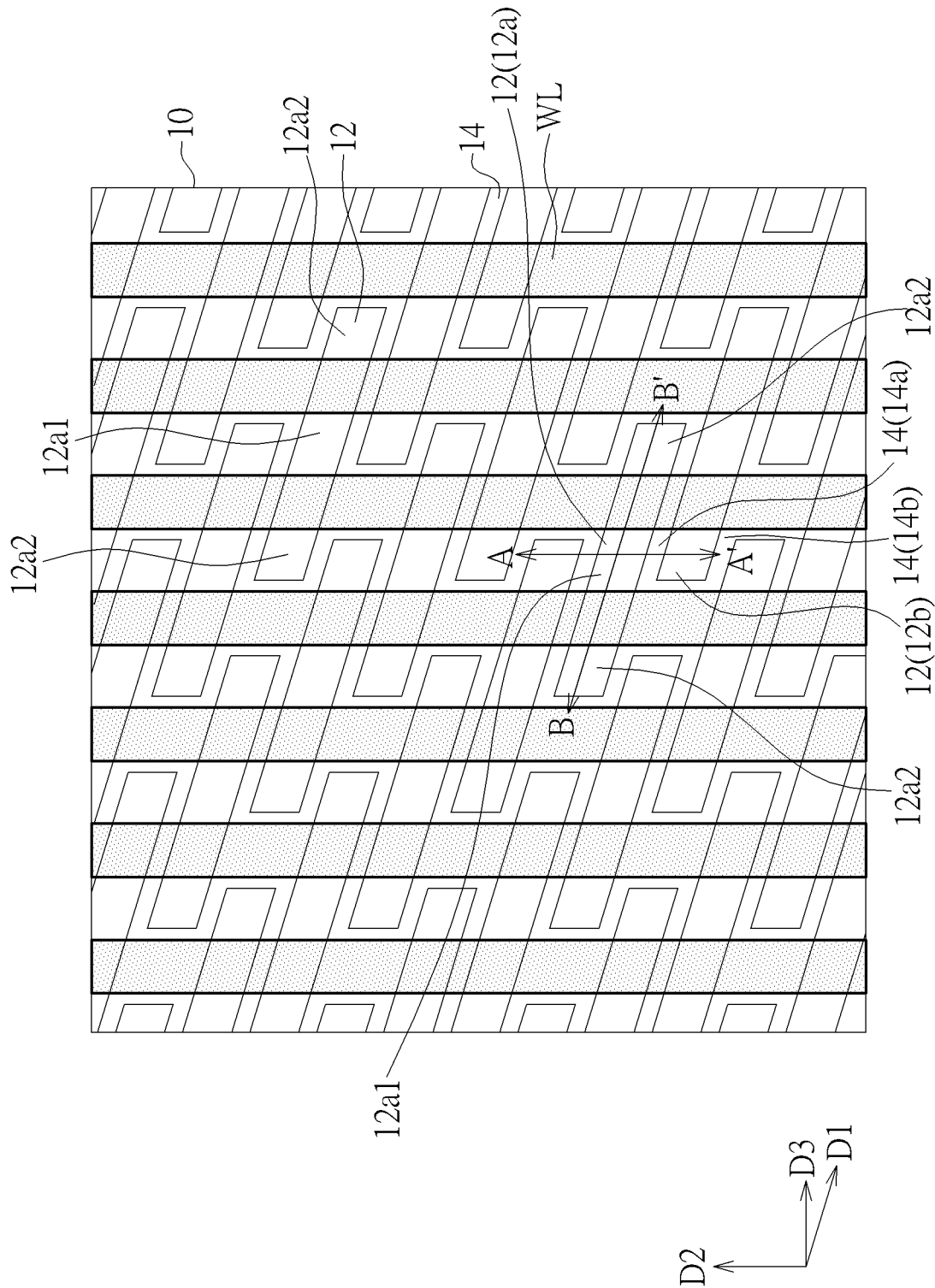
FIG. 1 to FIG. 9 are schematic diagrams illustrating the steps for manufacturing a dynamic random access memory device according to an embodiment of the present invention.
Figure 2:
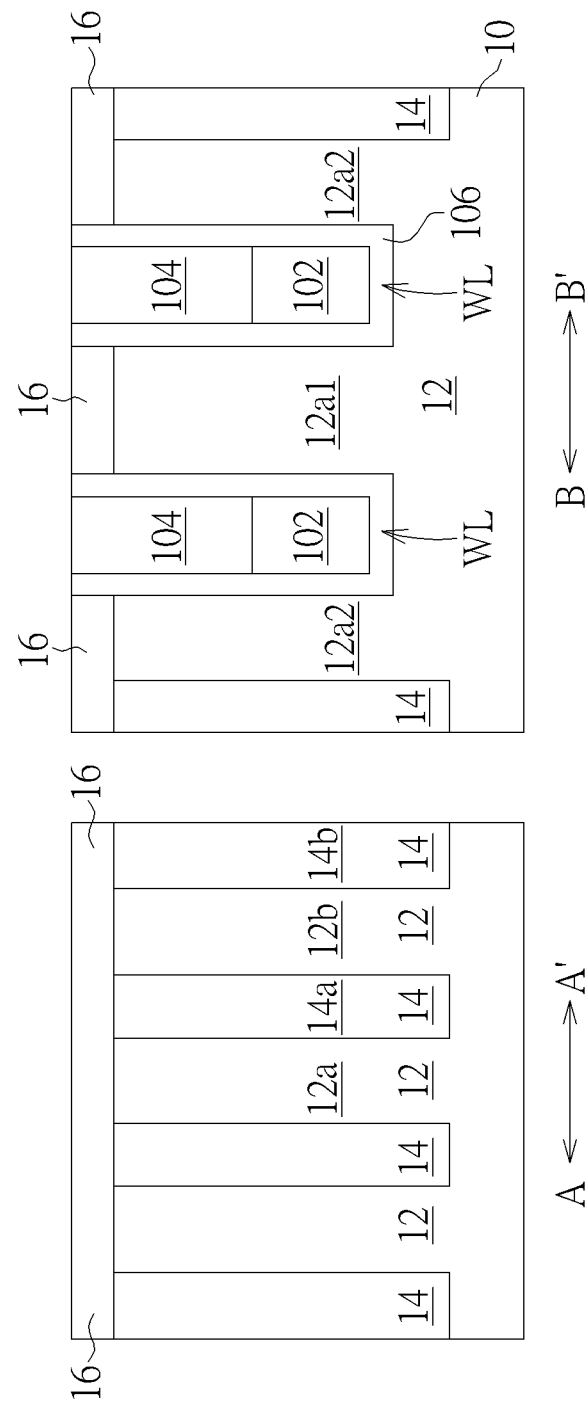
Figure 3:
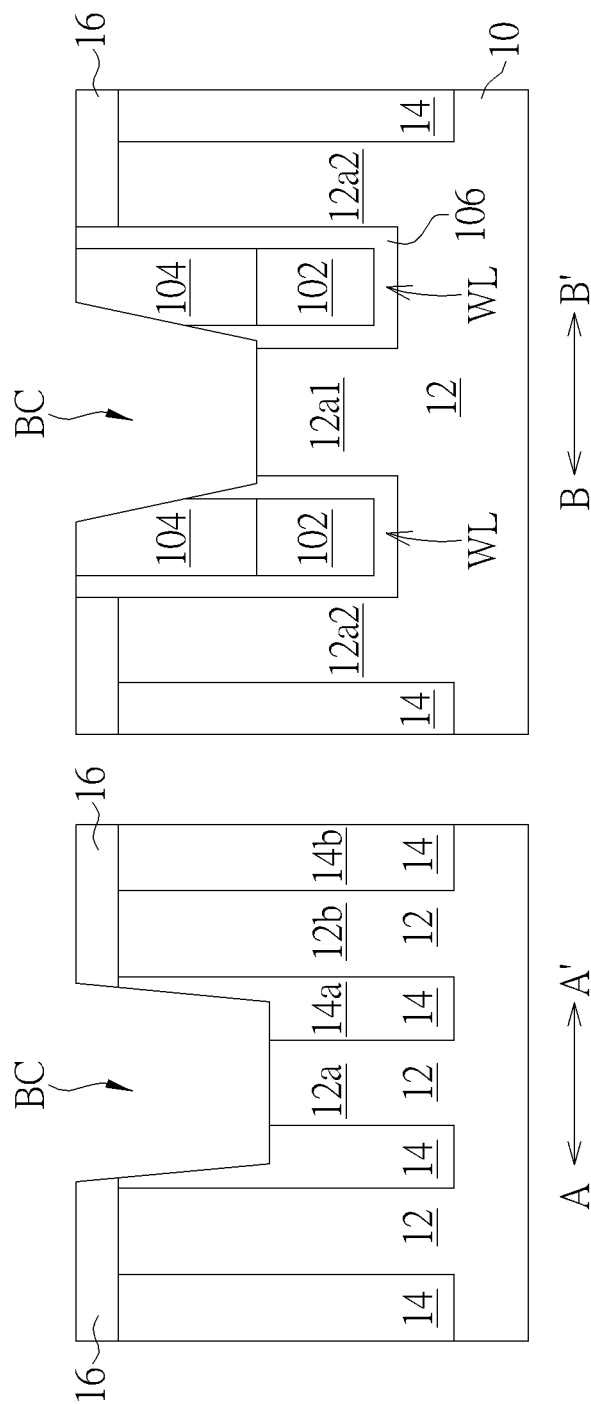
Figure 4:
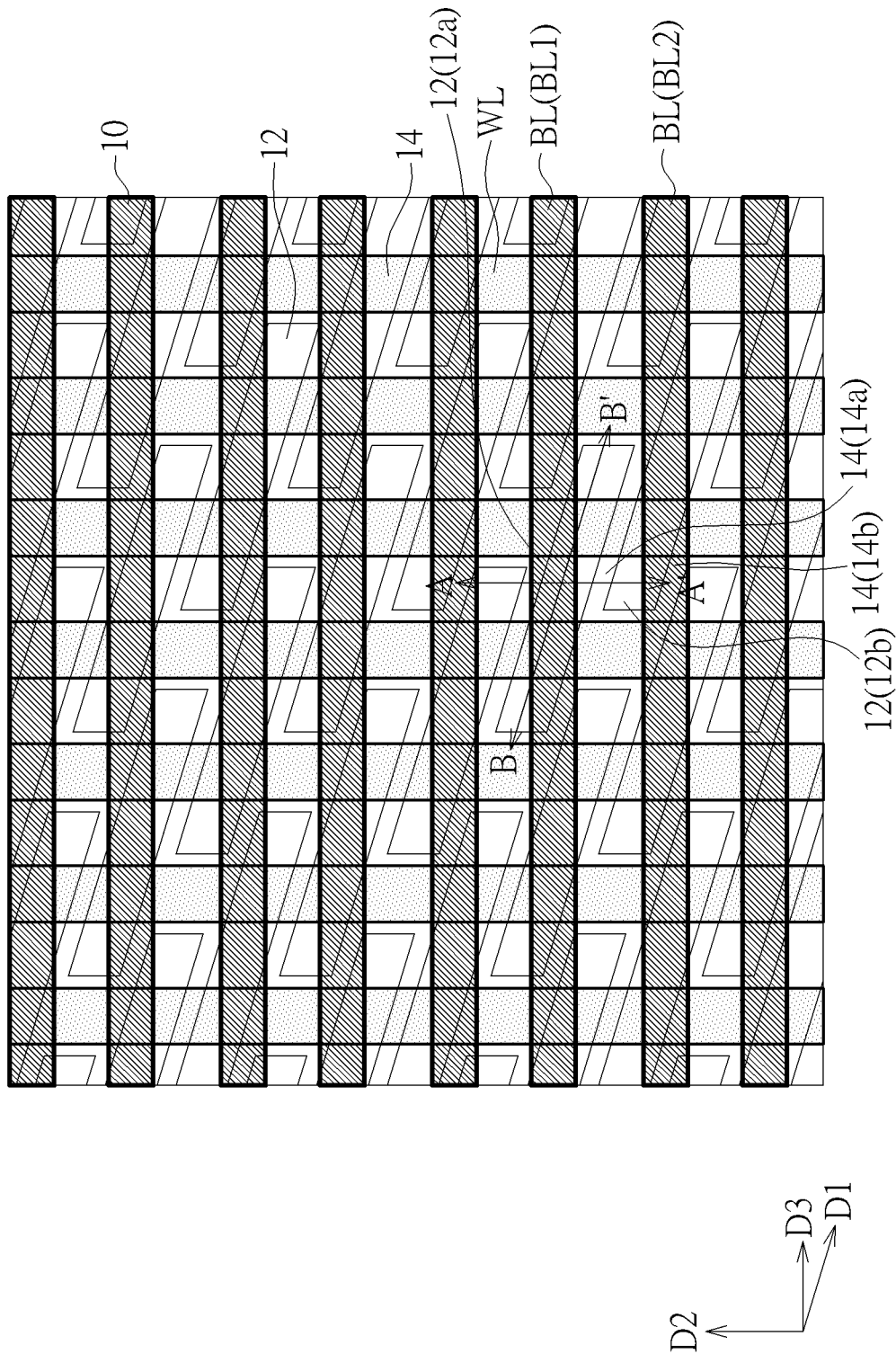

FIG. 1 to FIG. 9 are schematic diagrams illustrating the steps for manufacturing a dynamic random access memory device according to an embodiment of the present invention. FIG. 1 and FIG. 4 are plan views of the dynamic random access memory device. The drawings on the left sides of FIG. 2, FIG. 3, and FIG. 5 to FIG. 9 are cross-sectional views of the dynamic random access memory device taken along the line AA' as shown in FIG. 1 and FIG. 4. The drawings on the right sides of FIG. 2, FIG. 3, and FIG. 5 to FIG. 9 are cross-sectional views of the dynamic random access memory device taken along the line BB' as shown in FIG. 1 and FIG. 4. Some structures shown in the cross-sectional views of FIG. 2, FIG. 3, and FIG. 5 to FIG. 9 are omitted in the plan view of FIG. 1 and FIG. 4 for the sake of simplicity.

Please refer to FIG. 1 and FIG. 2. A substrate 10 is provided. The substrate 10 may be a silicon substrate, an epitaxial silicon substrate, a silicon germanium (SiGe) substrate, a silicon carbide (SiC) substrate, or a silicon-on-insulator (SOI) substrate, but is not limited thereto. An isolation structure 14 is formed in the substrate 10 to define a plurality of parallel active regions 12 in the substrate 10. The isolation structure 14 includes a dielectric material such as silicon oxide ($SiO_2$), silicon nitride (SiN), silicon oxynitride (SiON), silicon carbon nitride (SiCN), nitride doped silicon carbide (NDC), or a low-k dielectric material such as fluorinated silica glass (FSG), silicon oxycarbide (SiCOH), spin-on glass, porous low-k dielectric material, organic dielectric polymer, or a combination thereof, but is not limited thereto.

The active regions 12 respectively elongate along a direction D1 and are arranged along a direction D2 and a direction D3 to form an array. The directions D1, D2 and D3 are different directions, wherein the direction D2 and the direction D3 are perpendicular, and the direction D1 and the direction D3 may include an angle between 30 and 75 degrees. Heavy doped regions (not shown) may be formed in the surfaces of the active regions 12 for forming ohmic contacts with subsequently formed contact structures. In some embodiments, the heavy doped regions may be formed in the active regions 12 after forming the bit line contact recesses (such as the recess BC shown in FIG. 3) and the storage node contact recesses (such as the deep recess R1 shown in FIG. 8).

Subsequently, an insulating layer 16 may be formed on the substrate 10, and an etching process is performed to remove portions the insulating layer 16 and the substrate 10 to form a plurality of word line trenches (not shown) in the substrate 10. Following, deposition processes, etching processes and/or planarization processes are carried out to form a plurality of buried word lines WL in the word line trenches. The buried word lines respectively elongate along the direction D2 and are arranged in parallel along the direction D3. Each the buried word line may include a conductive layer 102 in a lower portion of the word line trench, an insulating capping layer 104 on the conductive layer 102 and filling the remaining spaces of the word line trench, and a gate dielectric layer 106 intervening between the conductive layer 102 and the insulating capping layer 104 and the substrate 10. The conductive layer 102 may include a metal material, such as tungsten (W), copper (Cu), aluminum (Al), titanium (Ti), tantalum (Ta), a work function metal, a compound, alloy or composite layer of the above metal materials, but is not limited thereto. The insulating layer 16, the insulating capping layer 104, and the gate dielectric layer 106 may respectively include a dielectric material such as silicon oxide ($SiO_2$), silicon nitride (SiN), silicon oxynitride (SiON), silicon carbide nitride (SiCN), high-k dielectric material, or a combination thereof, but is not limited thereto. According to some embodiments of the present invention, the insulating layer 16 and the insulating capping layer 104 may include the same material, such as silicon nitride (SiN). Each active region 12 is divided into a middle portion 12a1 and two end portions 12a2 by two buried word lines WL. In order to describe the features of the present invention more clearly, the active regions 12 and the portions of the isolation structure 14 shown in the cross-sectional view taken along the line AA' are defined as the first active region 12a, first isolation structure 14a, second active region 12b and second isolation structure 14b, as labeled in FIG. 1 and the drawing on the left side of FIG. 2. The first active region 12a and the second active region 12b are the middle portion and the end portion of two adjacent active regions 12, respectively.

Please refer to FIG. 3. A mask layer (not shown) may be formed on the substrate 10 and is patterned to form openings exposing the middle portions 12a1 of the active regions 12. An etching process is performed, through the openings to etch and recess the middle portions 12a1 of the active regions 12, thereby forming a recess BC on each of the middle portions 12a1. As shown in the drawing on the left side of FIG. 3, the first active region 12a is recessed and has a top surface lower than the top surface of the second active region 12b. A portion of the first isolation structure 14a may be etched and removed to become a part of the recess BC. Accordingly, the top surface of the first isolation structure 14a is lower than a top surface of the second isolation structure 14b.

Figure 5:
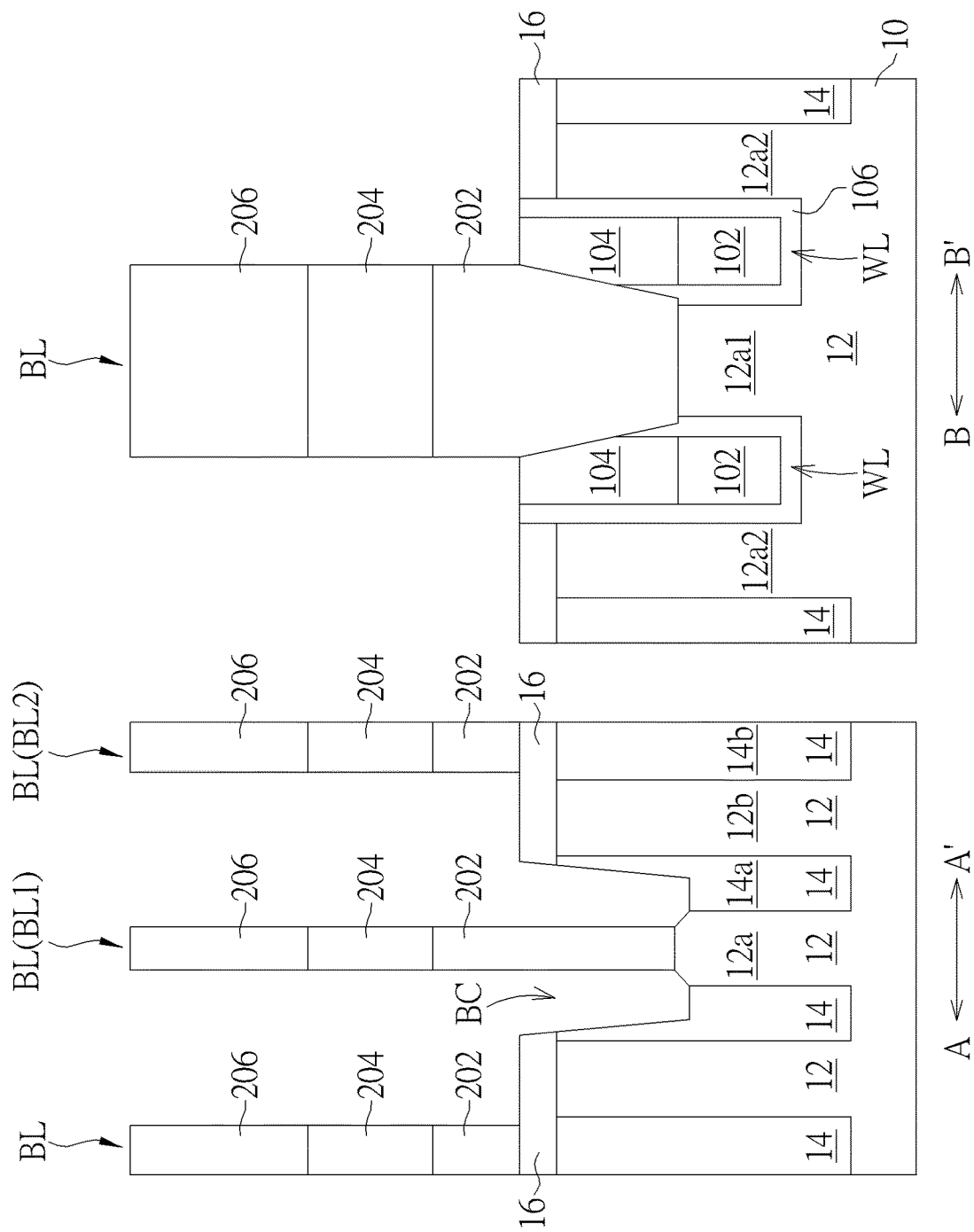

Please refer to FIG. 4 and FIG. 5. After forming the recess BC and removing the mask layer, deposition processes such as chemical vapor deposition processes are performed to form a semiconductor layer 202, a metal layer 204 and a mask layer 206 successively on the substrate 10. A patterning process such as photolithography-etching process is used to remove unnecessary portions of the semiconductor layer 202, the metal layer 204 and the mask layer 206, thereby forming a plurality of bit lines BL on the substrate 10. The bit lines BL respectively elongate along the direction D3 and arranged in parallel along the direction D2. The portions of the bit lines BL overlapping the recesses BC are in direct contact with the middle portions 12a1 and are used as bit line contacts to electrically connect the bit lines BL and the active regions 12. Other portions of the bit lines BL are separated and electrically isolated from the active regions 12 by the insulating layer 16. The material of the semiconductor layer 202 may include polysilicon, amorphous silicon, or other suitable semiconductor materials. The material of the metal layer 204 may include aluminum (Al), tungsten (W), copper (Cu), titanium aluminum (TiAl) alloy, or other suitable low resistance metal materials. The hard mask layer 206 may include a dielectric material such as silicon oxide ($SiO_2$), silicon nitride (SiN), silicon oxynitride (SiON), silicon carbide nitride (SiCN), high-k dielectric material, or a combination thereof, but is not limited thereto. In some embodiments, an interface layer (not shown) may be disposed between the semiconductor layer 202 and the metal layer 204. The interfacial layer may include a single layer or multiple layers made of titanium (Ti), tungsten silicide (WSi), tungsten nitride (WN), and/or other metal silicides or metal nitrides, but is not limited thereto. As shown in the drawing one the left side of FIG. 5, in order to describe the features of the present invention more clearly, the bit line BL disposed on the first active region 12a is defined as the first bit line BL1, and the bit line BL disposed on the second isolation structure 14b is defined as the second bit line BL2.

Figure 6:
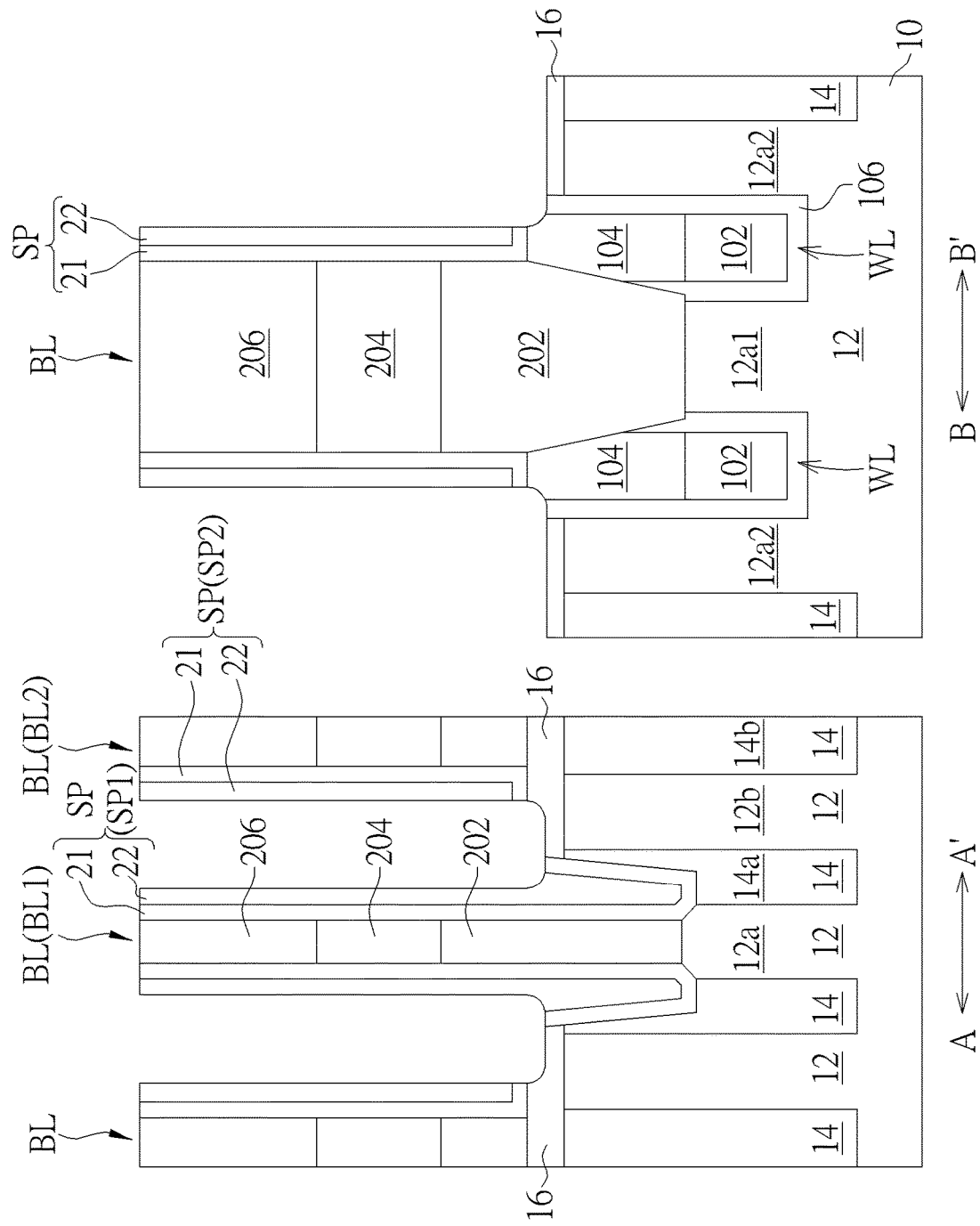

Please refer to FIG. 6. Subsequently, deposition processes and etching processes may be performed to form spacers SP on sidewalls of the bit lines BL and filling the recesses BC. According to some embodiments of the present invention, the spacers SP may respectively include a multi-layer structure. For example, each spacer SP may include a first insulating layer 21 and a second insulating layer 22, wherein the first insulating layer 21 is along the sidewall of the bit line BL and the surface of the recess BC at a side of the bit line BL, and the second insulating layer 22 is disposed on the first insulating layer 21 and fills the remaining space of the recess BC. The first insulating layer 21 and the second insulating layer 22 may respectively include a dielectric material, such as silicon oxide ($SiO_2$), silicon nitride (SiN), silicon oxynitride (SiON), silicon carbide nitride (SiCN), or a combination thereof, but is not limited thereto. According to an embodiment of the present invention, the first insulating layer 21 may include silicon nitride (SiN), and the second insulating layer 22 may include silicon oxide ($SiO_2$). As shown in the drawing on the left side of FIG. 6, in order to describe the features of the present invention more clearly, the spacers SP on the sidewalls of the first bit line BL1 are defined as the first spacers SP1, and the spacers SP on the sidewalls of the second bit line BL2 are defined as the second spacers SP2.

Figure 7:
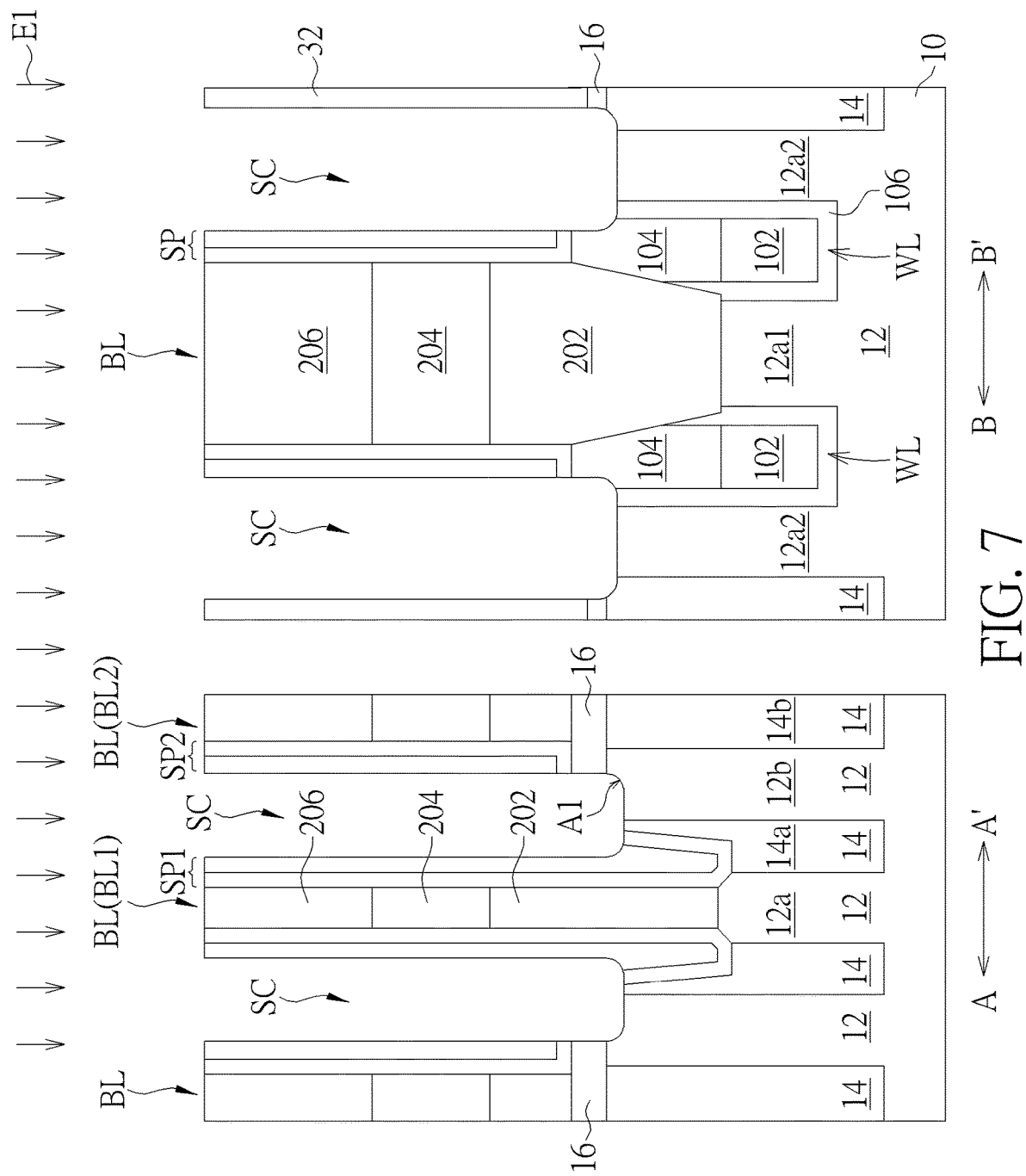

Please refer to FIG. 7. A deposition process may be performed to form a dielectric layer 32 on the substrate 10 and completely filling the spaces between the bit lines BL. Following, an etching process E1 such as a dry etching process is performed to remove portions of the dielectric layer 32 and the insulating layers 16, thereby forming a plurality of storage node contact holes SC between the bit lines BL. The storage node contact holes SC respectively extend through the dielectric layer 32 and the insulating layers 16 to expose the end portions 12a2 of the active regions 12. According to some embodiments of the present invention, the etching process E1 uses an etchant gas containing fluorine (F), such as tetrafluoromethane ($CF_4$), trifluoromethane ($CHF_3$), difluoromethane ($C_2F_2$), or a combination of thereof, but is not limited thereto. As shown in the drawing on the left side of FIG. 7, the top surfaces of the first isolation structure 14a and the second active region 12b are partially exposed from the storage node contact hole SC at one side of the first bit line BL1. The exposed top surface of the second active region 12b may have an area A1. As shown in the drawing on the right side of FIG. 7, the end portions 12a2 of the active region 12 are exposed from different storage node contact holes SC at different sides of the bit line BL.

Figure 8:
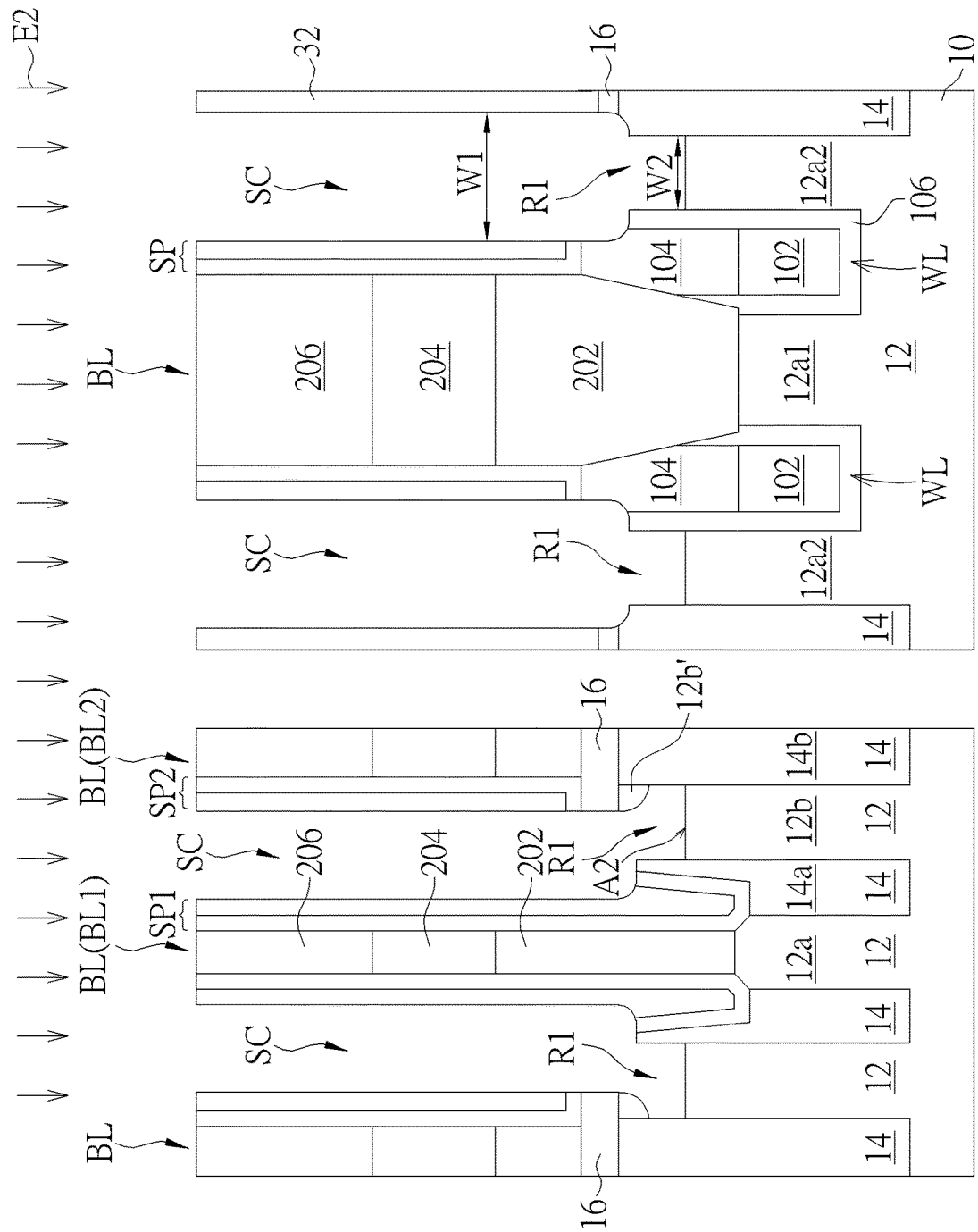

Please refer to FIG. 8. Following, another etching process E2 such as a wet etching process is performed, through the storage node contact holes SC to etch the end portions 12a2 of the active regions 12, thereby forming deep recesses R1 below and connected to each of the storage node contact holes SC and exposing the surfaces of the end portions 12a2. According to some embodiments of the present invention, the etching process E2 may selectively etch the substrate 10. In some embodiments when the substrate 10 is a silicon substrate, the etching process E2 may use etchant containing ammonium hydroxide ($NH_4OH$), potassium hydroxide (KOH), hydrofluoric acid (HF), tetramethylammonium hydroxide (TMAH), nitric acid ($HNO_3$), or a combination thereof, but is not limited thereto. In the cross-sectional view along line AA' as shown in the drawing on the left side of FIG. 8, each the deep recess R1 and the above storage node contact hole SC are not vertically aligned. Each deep recess R1 may extend laterally to be directly below the spacer SP on one of the bit lines BL. For example, the deep recess R1 between the first bit line BL1 and the second bit line BL may extend laterally to directly below the second spacer SP2, exposing the top surface of the second active region 12b and the sidewalls of the first isolation structure 14a and the second isolation structure 14b. The exposed top surface of the second active region 12b may have an area A2, and the area A2 is larger than or equal to the area A1. In some embodiments, a remaining portion 12b' of the active region 12 may be located between the deep recess R1 and the bottom surface 16a of the insulating layer 16. As shown in the drawing on the right side of FIG. 8, in the cross-sectional view along line BB', the deep recess R1 and the corresponding storage node contact hole SC are substantially vertically aligned. Sidewalls (or portions of the gate dielectric layer 106 and the insulating capping layer 104) of the buried word lines WL at two sides of the middle portion 12a1 are exposed from the deep recesses R1.

Since the deep recesses R1 are formed by selectively etching the end portions 12a2 of the active regions 12, the widths of the deep recesses R1 are determined by the widths of the end portions 12a2. In some embodiments, the deep recess R1 and the corresponding storage node contact hole SC have different widths. For example, as shown in the drawing on the right side of FIG. 8, the storage node contact hole SC has a width W1, the deep recess R1 has a width W2, and the width W2 may be smaller than the width W1.

The exposed top surface of the second active region 12b (the end portion) exposed from the deep recesses R1 are not limited to be planar as shown in FIG. 8 and may have other shapes. In other embodiments, by using proper wet etchants during the etching process E2, the top surface of the second active region 12b may be concave, convex, slopped, or may have included angles, but is not limited thereto. It may be ensured to obtain the larger area A2 by using proper etchant and/or adjusting the depths of the deep recesses R1.

Figure 9:
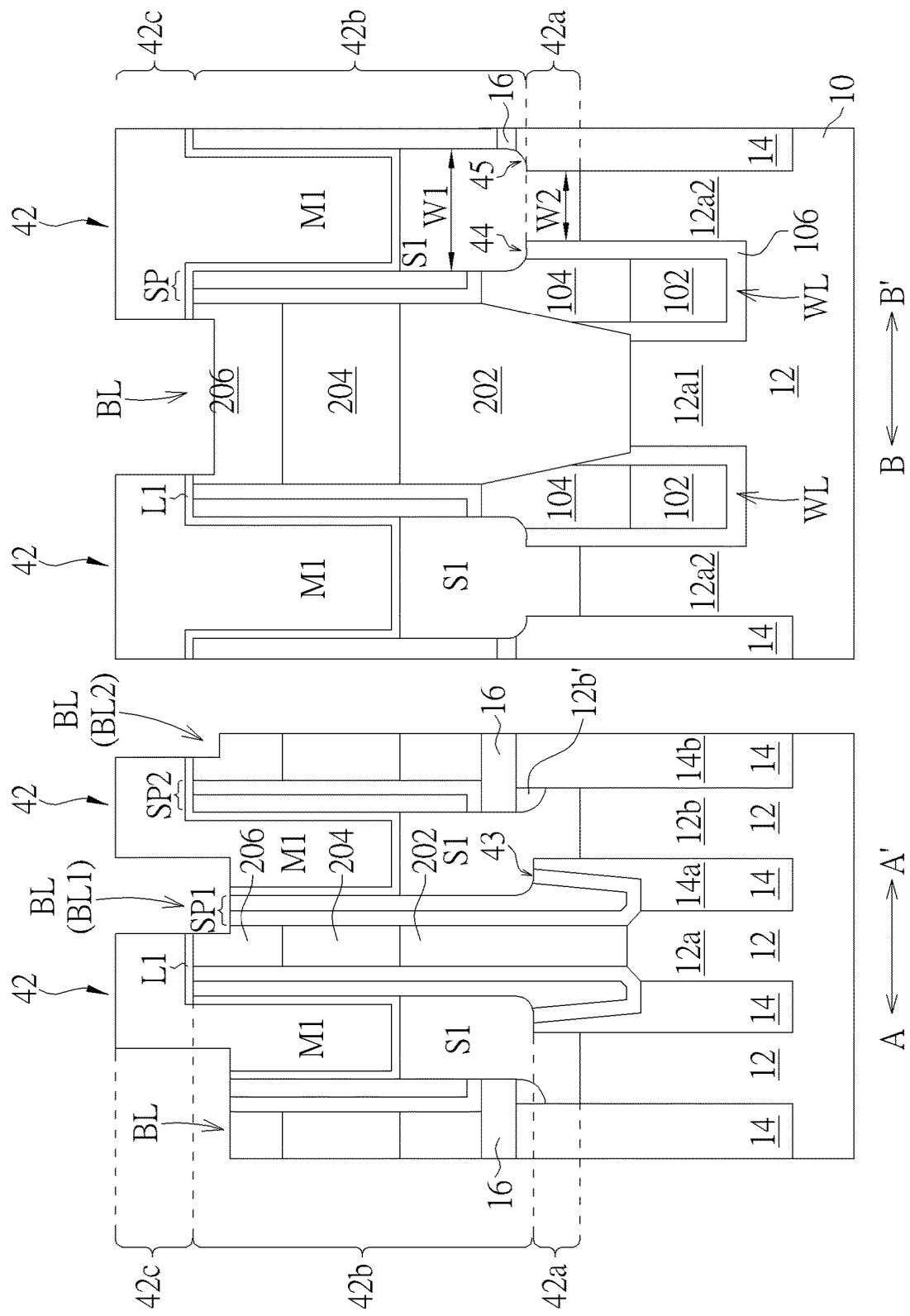

Please refer to FIG. 9. An epitaxial growth process and/or a deposition process may be performed to form semiconductor layers S1 to fill the deep recesses R1 and lower portions of the storage node contact holes SC. Subsequently, a barrier layer L1 is formed to cover the top surfaces of the semiconductor layers S1, the spacers SP and the top surfaces of the bit lines BL. A metal layer M1 is then formed on the barrier layer L1, covering the bit lines BL and completely filling the remaining spaces of the storage node contact holes SC. A recess process is performed to pattern the metal layer M1 and the barrier layer L1 outside the storage node contact holes SC, thereby forming the storage node contact structures 42 respectively disposed in the storage node contact holes SC and the deep recesses R1. The storage node contact structures 42 directly and electrically contact the end portions 12a2 of the active regions 12. More specifically, each of the storage node contact structures 42 includes three parts, which are the contact portion 42a filling the deep recess R1 and directly contacting the end portion 12a2, the plug portion 42b on the contact portion 42a and filling the storage node contact hole SC, and the pad portion 42c on the plug portion 42b and outside the storage node contact hole SC. The contact portion 42a is made from the semiconductor layer S1. The plug portion 42b is made from the semiconductor layer S1 and the metal layer M1. The pad portion 42c is made from the metal layer M1. The semiconductor layer S1 may include crystalline silicon, polysilicon, amorphous silicon or other suitable semiconductor materials. The metal layer M1 may include tungsten (W), copper (Cu), aluminum (Al), titanium (Ti), tantalum (Ta), a compound, alloy or composite layer of the above metal materials, but is not limited thereto. The shapes, depths, and locations of the contact portion 42a and the plug portion 42b of each storage node contact structures 42 are determined by the deep recess R1 and the storage node contact hole SC. That is, the contact portion 42a may have the width W2, and the plug portion 42b may have the width W1, wherein the width W2 is smaller than the width W1. In the cross-sectional view along line AA' as shown in the drawing on the left side of FIG. 9, the contact portion 42a and the plug portion 42b of each of the storage node contact structures 42 are not vertically aligned. Each contact portion 42a may extend laterally to be directly below the spacer SP on one of the bit lines BL. The shapes of the interfacing surface between the contact portion 42a and the end portion 12a2 may be concave, convex, slopped, or may have included angles, but is not limited thereto.

At this point, the dynamic random access memory device according to one embodiment of the present invention is completed. In one perspective view as shown in the drawing on the left side of FIG. 9, the dynamic random access device includes a substrate 10 having a first active region 12a, a first isolation region 14a, a second active region 12b, and a second isolation region 14b arranged in order along a first direction (the extending direction of line AA'). A first bit line BL1 is disposed on the first active region 12a and directly and electrically contacts the first active region 12a. A second bit line BL2 is disposed on the second isolation region 14b. An insulating layer 16 is disposed between and separates the second bit line BL2 and the second isolation region 14b. A storage node contact structure 42 is disposed between the first bit line BL1 and the second bit line BL2 and directly contacts a top surface of the second active region 12b, a sidewall of the first isolation region 14a, and a sidewall of the second isolation region 14b.

In some embodiments, a top surface of the first active region 12a is recessed to be lower than a top surface of the second active region 12b. A bottom surface of the storage node contact structure 42 is higher than a bottom surface of the first bit line BL1 and is lower than a bottom surface of the second bit line BL2. A portion of the first isolation structure 14a is removed when forming the recess BC, so that a top surface of the first isolation structure 14a is lower than a top surface of the second isolation structure 14b.

In some embodiments, due to a misalignment between the storage node contact hole SC and the deep recess R1, a bottom portion of the storage node contact structure 42 may have a step profile.

In some embodiments, a first spacer SP1 and a second spacer SP2 are respectively disposed on a sidewall of the first bit line BL1 and a sidewall of the second bit line BL2 to separate and electrical isolate the storage node contact structure 42 from the first bit line BL1 and the second bit line BL2. The storage node contact structure 42 may include a bottom corner 43 disposed on the first spacer SP1 and an extending portion directly below the second spacer SP2 (or below the insulating layer 16).

In some embodiments, a remaining portion 12b' of the active region 12 formed by the etching process E2 may be disposed between the storage node contact structure 42, the insulating layer 16 and the second isolation structure 14b.

In some embodiments, the storage node contact structure 42 includes a lower semiconductor layer S1 that directly contacts the top surface of the second active region 12b, the sidewall of the first isolation structure 14a and the sidewall of the second isolation structure 14b and an upper metal layer M1 disposed on the semiconductor layer S1.

In another perspective view, as shown in the drawing on the right side of FIG. 9, the dynamic random access memory device includes a substrate 10 having an active region 12 and two isolation regions 14 at two sides of the active region 12. Two buried word lines WL are formed in the active region 12 to divide the active region 12 into a middle portion 12a1 and two end portions 12a2. A bit line BL is disposed on and directly and electrically contacts the middle portion 12a1. A storage node contact structure 42 is disposed on each of the end portions 12a2 and includes a lower contact portion 42a and an upper plug portion 42b. The contact portion 42a directly contacts a top surface of one of the end portions, a sidewall of one of the buried word lines WL and a sidewall of one of the isolation regions 14. A width W2 of the plug portion 42b is larger than a width W1 of the contact portion 42a.

In some embodiments, a step profile is formed between the contact portion 42a and the plug portion 42b. The plug portion 42b has a bottom corner 44 disposed on one of the buried word lines WL and another bottom corner disposed on one of the isolation regions 14.

In some embodiments, a spacer SP is disposed on the sidewall of the bit line BL to electrically isolate the storage node contact structure 42 and the bit line BL.

In some embodiments, the top surface of the middle portion 12a1 is recessed to be lower than the top surfaces of the end portions 12a2. The bottom surface of the storage node contact structure 42 is higher than the bottom surface of the bit line BL and is lower than the top surface of each of the buried word lines WL.

In some embodiments, the contact portion 42a and the lower part of the plug portion 42b are made from a semiconductor layer S1. The upper part of the plug portion 42b is made from a metal layer M1.

Figure 10:
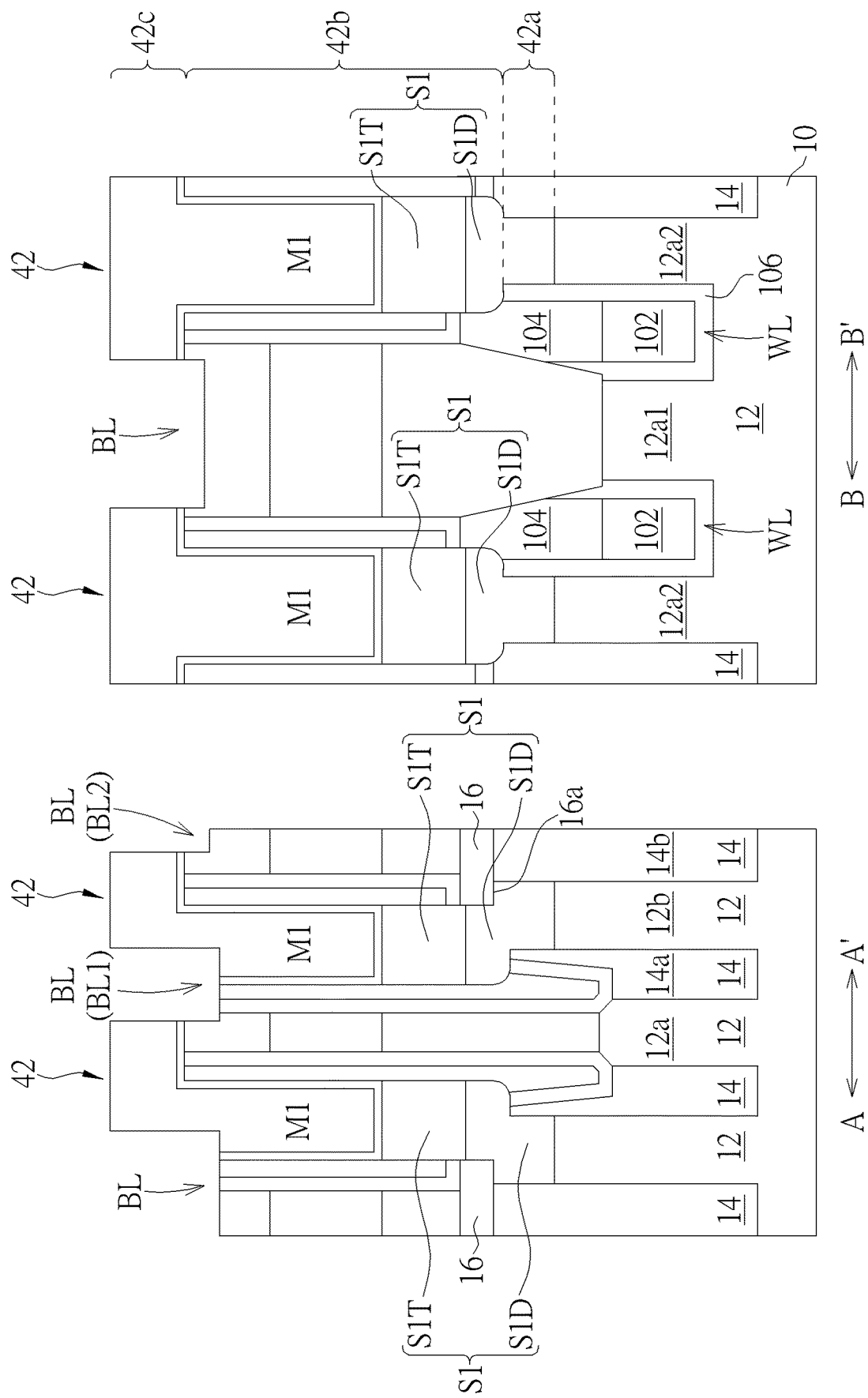
FIG. 10 is a schematic diagram illustrating a cross-sectional view of a dynamic random access memory device according to another embodiment of the present invention.

Please refer to FIG. 10, which is a schematic diagram illustrating a cross-sectional view of a dynamic random access memory device according to another embodiment of the present invention. A difference between FIG. 9 and FIG. 10 is that, by adjusting the process parameters (such as lateral etching rate or etching time) of the etching process E2 for forming the deep recess R1, the remaining portion 12' between the deep recess R1 and the bottom surface of the insulating layer 16 may be completely removed. Accordingly, as shown in FIG. 10, the storage node contact structure 42 may directly contact the bottom surface 16a of the insulating layer 16. Furthermore, the semiconductor layer S1 may include a lower portion S1D and an upper portion S1T connected between the lower portion S1D and the metal layer M1, wherein the lower portion S1D is made from an epitaxial semiconductor layer and completely fills the deep recess R1, and the upper portion S1T is made from a deposited semiconductor layer that has a material different from the material of the epitaxial semiconductor layer of the lower portion S1D. According to an embodiment of the present invention, the lower portion S1D is made of crystalline silicon, and the upper portion S1T is made of polysilicon. In a preferred embodiment, the deposition process for forming the upper portion S1T is carried out after the top surface of the lower portion S1D is grown to be higher than the bottom surface 16a of the insulating layer 16.

In conventional technology, after forming the storage node contact holes, a deposition process is immediately carried out to form the materials of the storage node contact structures to fill the storage node contact holes. However, due to inline process variation, the storage node contact holes may have insufficient depths, misalignments, and/or abnormal bottom profiles, which may adversely cause insufficient contacting areas and increased resistance between the storage node contact structures and the active regions. The present invention may solve the problem by performing an additional etching process (such as the etching process E2 shown in FIG. 8) to further recess the end portions of the active regions and increase the exposed areas of the end portions (for example, from area A1 to the area A2). Accordingly, the storage node contact structures and the active regions may have larger contact areas and lower contact resistances, so that the performance of the dynamic random access memory device may be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dynamic random access memory device, comprising:
   a substrate comprising a first active region, a first isolation region, a second active region, and a second isolation region arranged in order along a first direction;
   a first bit line disposed on the first active region and direct contacting the first active region;
   a second bit line disposed on the second isolation region;
   an insulating layer disposed between and separating the second bit line and the second isolation region; and
   a storage node contact structure disposed between the first bit line and the second bit line and directly contacting a top surface of the second active region, a sidewall of the first isolation region, and a sidewall of the second isolation region.

2. The dynamic random access memory device according to claim 1, wherein a bottom portion of the storage node contact structure comprises a step profile.

3. The dynamic random access memory device according to claim 1, further comprising:
   a first spacer disposed between a sidewall of the first bit line and the storage node contact structure; and
   a second spacer disposed between a sidewall of the second bit line and the storage node contact structure.

4. The dynamic random access memory device according to claim 3, wherein a bottom corner of the storage node contact structure is on the first spacer.

5. The dynamic random access memory device according to claim 3, wherein a portion of the storage node contact structure extends to directly below the second spacer.

6. The dynamic random access memory device according to claim 1, wherein the storage node contact structure directly contacts a bottom surface of the insulating layer.

7. The dynamic random access memory device according to claim 1, further comprising a remaining portion of the second active region disposed between the storage node contact structure, the insulating layer and the second isolation region.

8. The dynamic random access memory device according to claim 1, wherein a top surface of the first active region is lower than the top surface of the second active region.

9. The dynamic random access memory device according to claim 1, wherein a top surface of the first isolation region is lower than a top surface of the second isolation region.

10. The dynamic random access memory device according to claim 1, wherein the storage node contact structure comprises a semiconductor layer and a metal layer disposed on the semiconductor layer, wherein the semiconductor layer directly contacts the top surface of the second active region, the sidewall of the first isolation region, and the sidewall of the second isolation region.

11. The dynamic random access memory device according to claim 10, wherein the semiconductor layer comprises:
    a lower portion comprising an epitaxial semiconductor layer, wherein a top surface of the lower portion is higher than a bottom surface of the insulating layer; and
    an upper portion between the lower portion and the metal layer and comprising a deposited semiconductor layer.

* * * * *